United States Patent
Cho et al.

(10) Patent No.: US 10,388,611 B2
(45) Date of Patent: Aug. 20, 2019

(54) SEMICONDUCTOR DEVICE AND METHOD OF FORMING MAGNETIC FIELD SHIELDING WITH FERROMAGNETIC MATERIAL

(71) Applicant: STATS ChipPAC Pte. Ltd., Singapore (SG)

(72) Inventors: Sungwon Cho, Seoul (KR); Seonhong Choi, Seoul (KR); Changoh Kim, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 6 days.

(21) Appl. No.: 15/456,873

(22) Filed: Mar. 13, 2017

(65) Prior Publication Data

US 2018/0261550 A1      Sep. 13, 2018

(51) Int. Cl.
| | | |
|---|---|---|
| *H01L 23/552* | (2006.01) | |
| *H01L 43/10* | (2006.01) | |
| *H01L 23/31* | (2006.01) | |

(52) U.S. Cl.
CPC ........ *H01L 23/552* (2013.01); *H01L 23/3128* (2013.01); *H01L 23/3135* (2013.01); *H01L 43/10* (2013.01)

(58) Field of Classification Search
CPC .............................. H01L 23/29; H01L 23/552
See application file for complete search history.

(56) References Cited

U.S. PATENT DOCUMENTS

| | | | |
|---|---|---|---|
| 5,561,265 A | 10/1996 | Livshits et al. | |
| 5,639,989 A | 6/1997 | Higgins, III | |
| 8,350,367 B2 | 1/2013 | Chiu et al. | |
| 2005/0013082 A1* | 1/2005 | Kawamoto | H01L 24/16 |
| | | | 361/118 |

(Continued)

OTHER PUBLICATIONS

FDK Corporation, EMI Suppression Sheets (PE Series) EC-ECE002-201512, downloaded Feb. 14, 2017, http://www.fdk.com/cyber-e/emc/sheet.html.*

*Primary Examiner* — Kyoung Lee
*Assistant Examiner* — Christina A Sylvia
(74) *Attorney, Agent, or Firm* — Robert D. Atkins; Patent Law Group: Atkins and Associates, P.C.

(57) ABSTRACT

A semiconductor device has a substrate and a semiconductor component disposed over the substrate. A discrete electrical device can be disposed over the substrate. An encapsulant is deposited over the substrate and semiconductor component. A ferromagnetic material is disposed over the encapsulant. The ferromagnetic material includes one or more ferrite type materials or other material having a crystalline structure exhibiting ferromagnetic properties. The ferromagnetic material includes a ferromagnetic film with a polyethylene terephthalate layer, ferrite layer, and adhesive layer. The ferromagnetic film is provided from the sheet of ferromagnetic films. A shielding layer is formed over the ferromagnetic material and around the semiconductor component. The ferromagnetic material provides magnetic shielding to reduce the influence of magnetic flux fields on the semiconductor die over all frequency bands, including low-frequency interference, by forming a low reluctance magnetic flux loop to redirect the magnetic flux fields away from the semiconductor die.

21 Claims, 8 Drawing Sheets

(56) References Cited

U.S. PATENT DOCUMENTS

| | | | |
|---|---|---|---|
| 2005/0045358 A1* | 3/2005 | Arnold | H05K 9/0024 |
| | | | 174/51 |
| 2008/0157296 A1* | 7/2008 | Yoshino | H01L 23/3128 |
| | | | 257/659 |
| 2014/0151859 A1 | 6/2014 | Kim et al. | |
| 2014/0197505 A1* | 7/2014 | Zhou | H01L 23/552 |
| | | | 257/422 |
| 2014/0231973 A1* | 8/2014 | Huang | H01L 23/49894 |
| | | | 257/659 |
| 2015/0348936 A1* | 12/2015 | Lin | H01L 23/552 |
| | | | 257/659 |
| 2016/0057897 A1* | 2/2016 | Malek | H05K 9/0024 |
| | | | 361/752 |

* cited by examiner

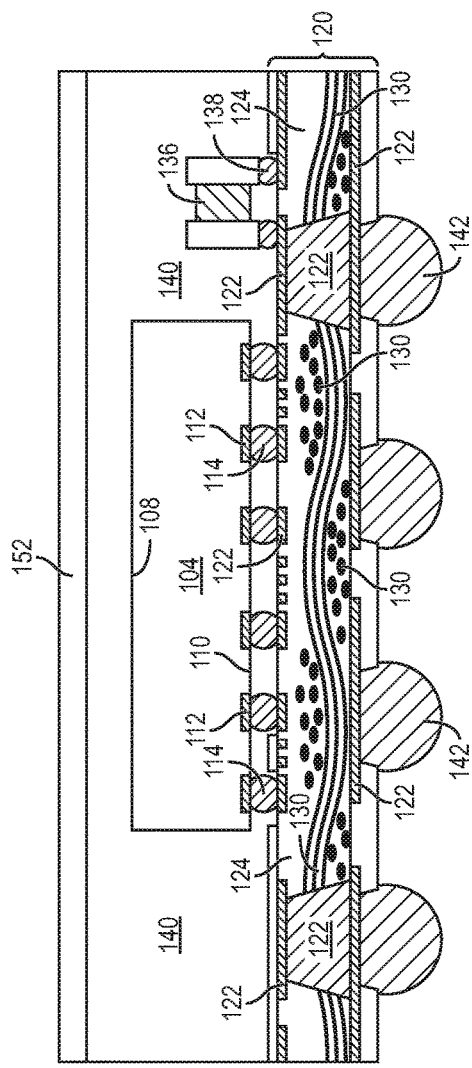
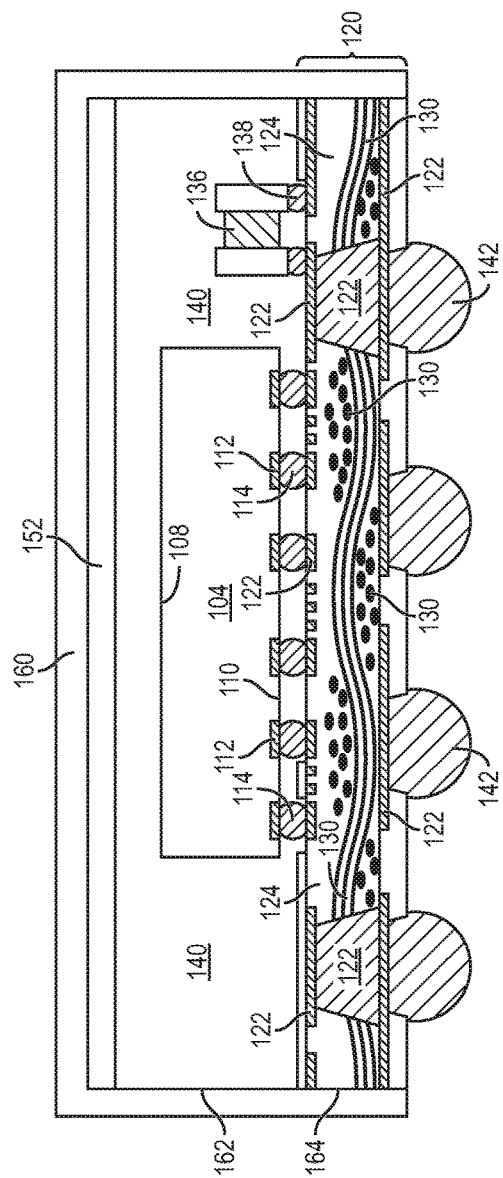

SEMICONDUCTOR DEVICE AND METHOD OF FORMING MAGNETIC FIELD SHIELDING WITH FERROMAGNETIC MATERIAL

FIELD OF THE INVENTION

The present invention relates in general to semiconductor devices and, more particularly, to a semiconductor device and method of forming magnetic field shielding with ferromagnetic material.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particular in high-frequency applications such as radio frequency (RF) wireless communications, often contain one or more integrated passive devices (IPDs) to perform necessary electrical functions. The IPDs are susceptible to magnetic B fields, electromagnetic interference (EMI), radio frequency interference (RFI), harmonic distortion, or other inter-device interference, such as capacitive, inductive, or conductive coupling, also known as cross-talk, which can interfere with their operation. The high-speed switching of digital circuits also generate interference. The semiconductor package can be enclosed with metal shielding to isolate sensitive circuits. The metal shielding alone is often less than effective for some types of interference, such as low-frequency magnetic B fields.

BRIEF DESCRIPTION OF THE DRAWINGS

FIGS. 2a-2j illustrate a process of forming magnetic field shielding with a ferromagnetic material;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
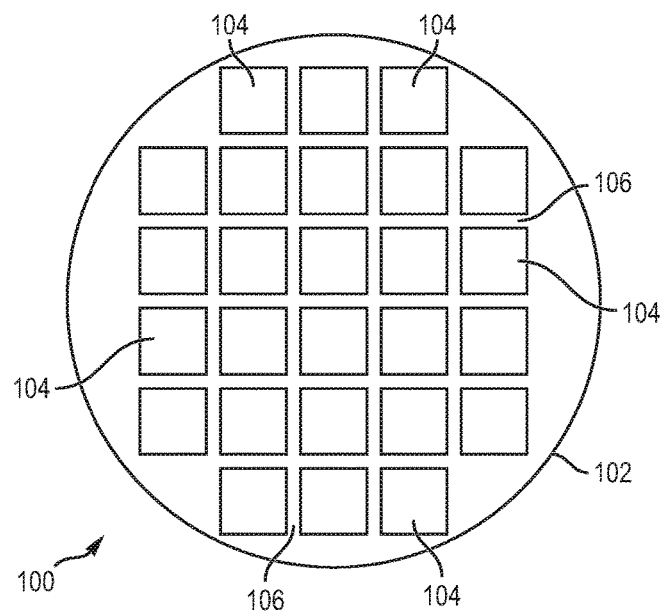
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
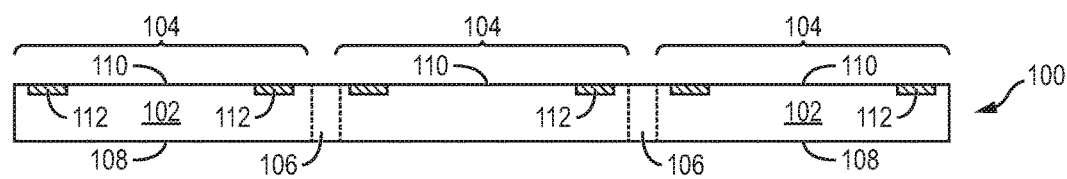

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
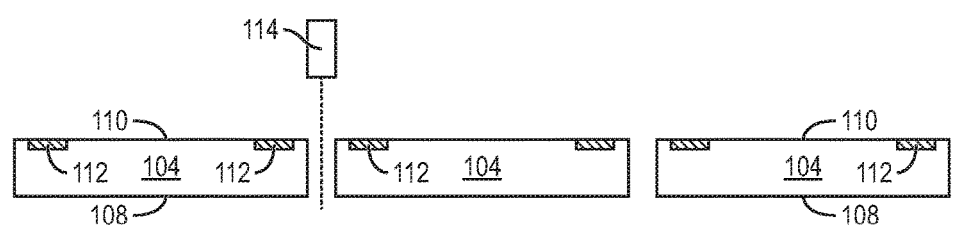

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post singulation.

Figure 2A:
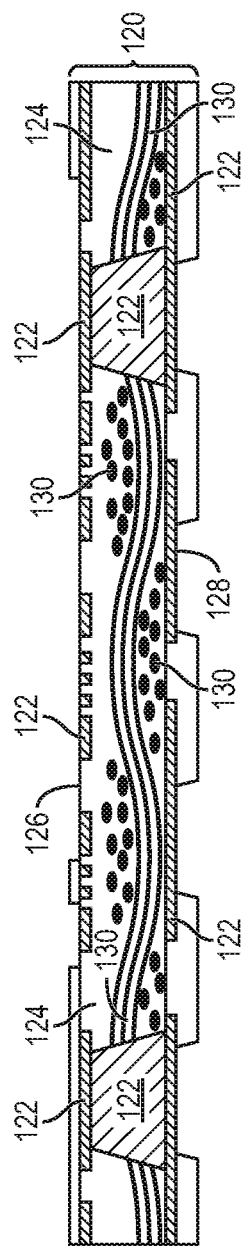

FIGS. 2a-2j illustrate a process of forming magnetic field shielding with ferromagnetic material. FIG. 2a shows a cross-sectional view of substrate 120 including conductive layers 122 and insulating layer 124. Conductive layer 122 can be one or more layers of Al, Cu, Sn, Ni, Au, Ag, or other suitable electrically conductive material. Conductive layer 122 provides horizontal electrical interconnect across substrate 120 and vertical electrical interconnect between surface 126 and surface 128 of substrate 120. Portions of conductive layer 122 can be electrically common or electrically isolated depending on the design and function of semiconductor die 104. Insulating layer 124 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layer 124 provides isolation between conductive layers 122. Substrate 120 further includes core material 130, such as glass fabric, to reinforce the substrate and reduce warpage.

Figure 2B:
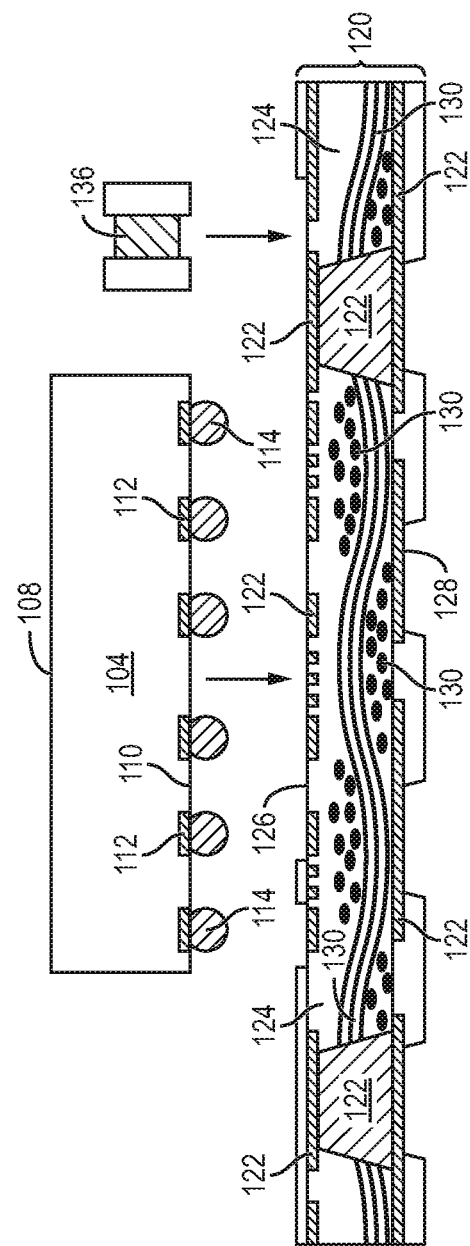
Figure 2C:
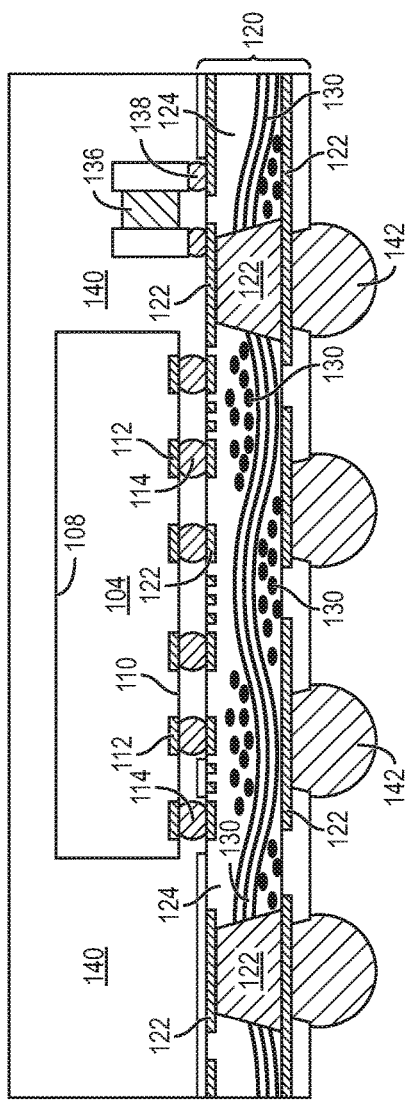

In FIG. 2b, semiconductor die 104 from FIG. 1c is positioned over substrate 120 using a pick and place operation with active surface 110 and bumps 114 oriented toward surface 126. Discrete electrical device 136 is also positioned over surface 126 of substrate 120. In one embodiment, discrete electrical device 136 is a semiconductor device or IPD, such as a resistor, capacitor, and inductor. FIG. 2c shows semiconductor die 104 bonded to a first portion of conductive layer 122 of substrate 120 by reflowing bumps 114. Discrete electrical device 136 is bonded to a second portion of conductive layer 122 of substrate 120 with bumps or conductive paste 138.

An encapsulant or molding compound 140 is deposited over semiconductor die 104, discrete electrical device 136, and substrate 120 using a paste printing, compressive molding, transfer molding, liquid encapsulant molding, vacuum lamination, spin coating, or other suitable applicator. Encapsulant 140 can be polymer composite material, such as epoxy resin with filler, epoxy acrylate with filler, or polymer with proper filler. Encapsulant 140 is non-conductive, provides structural support, and environmentally protects the semiconductor device from external elements and contaminants.

An electrically conductive bump material is deposited over conductive layer 122 on surface 128 of substrate 120 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form balls or bumps 142. In one embodiment, bump 142 is formed over a UBM having a wetting layer, barrier layer, and adhesive layer. Bump 142 can also be compression bonded or thermocompression bonded to conductive layer 122. Bump 142 represents one type of interconnect structure that can be formed over conductive layer 122. The interconnect structure can also use bond wires, conductive paste, stud bump, micro bump, or other electrical interconnect.

Semiconductor die 104 may contain IPDs that are susceptible to magnetic flux B fields, EMI, RFI, harmonic distortion, and inter-device interference. For example, the IPDs contained within semiconductor die 104 provide the electrical characteristics needed for high-frequency applications, such as resonators, high-pass filters, low-pass filters, band-pass filters, symmetric Hi-Q resonant transformers, and tuning capacitors.

Figure 2D:
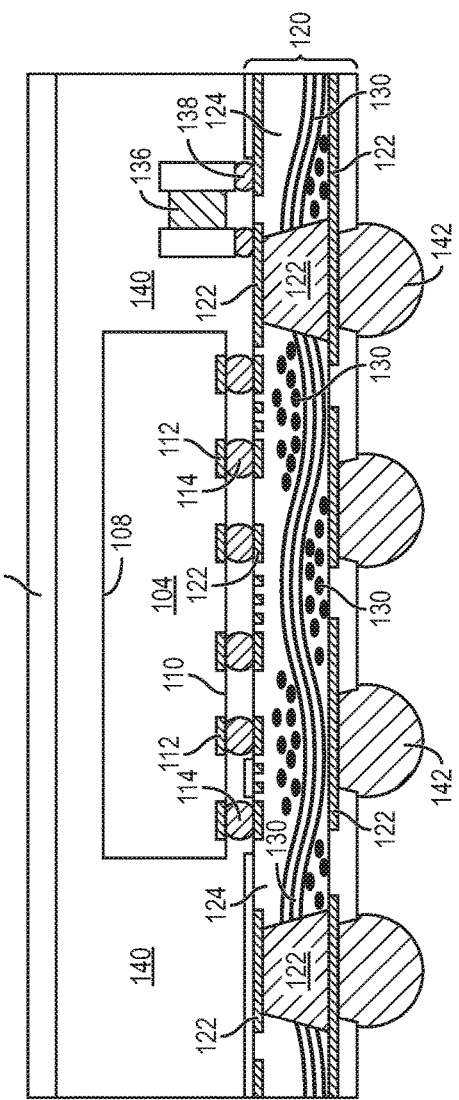

To reduce the effects of magnetic flux B fields, EMI, and RFI, ferromagnetic material 150 is disposed over back surface 108 of semiconductor die 104, as shown in FIG. 2d. Ferromagnetic material 150 includes one or more materials selected from the group of cobalt (Co), iron (Fe), iron oxide (Fe2O3), nickel (Ni), chromium oxide (CrO2), gadolinium (Gd), terbium (Tb), dysprosium (Dy), MnBi, MnSb, MnAs, and other ferrite or material having a crystalline structure exhibiting ferromagnetic properties. Ferromagnetic material 150 can also be rare-earth materials with lanthanide elements with the ability to carry large magnetic moments in well-localized f-orbitals.

Figure 2E:
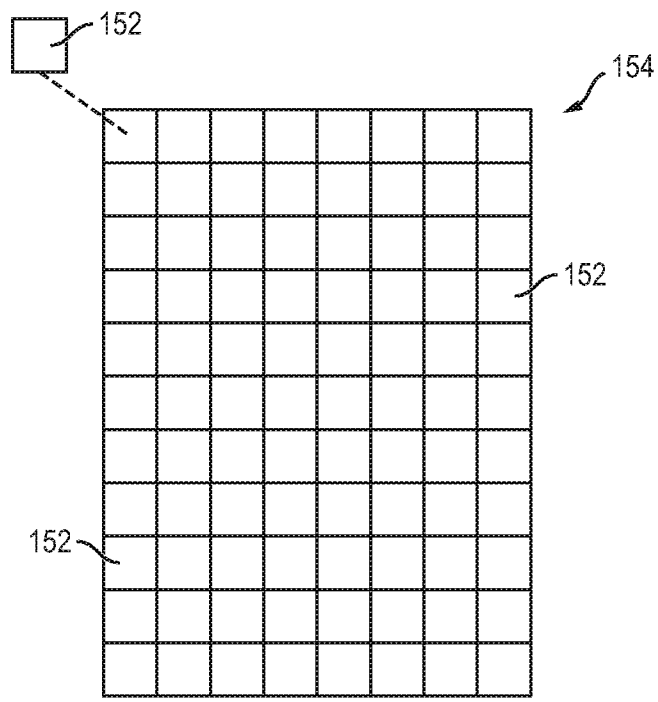
Figure 2F:
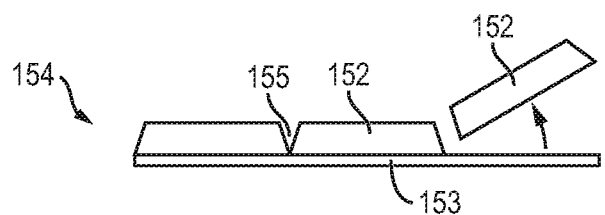
Figure 2G:
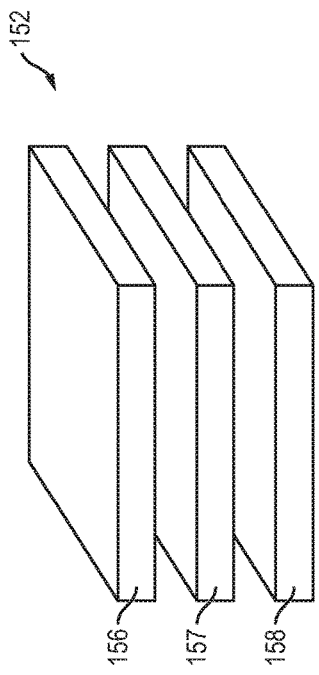

In one embodiment, ferromagnetic material 150 is implemented as ferromagnetic film 152 affixed to sheet 154 of many such ferromagnetic films, as shown in FIG. 2e. Sheet 154 of ferromagnetic films 152 is a low cost and easy option to form ferromagnetic material 150 over back surface 108 of semiconductor die 104. In FIG. 2f, ferromagnetic film 152 is peeled or removed from release layer 153 of sheet 154 along cut lines 155. FIG. 2g shows further detail of ferromagnetic film 152 including polyethylene terephthalate (PET) layer 156, ferrite layer 157, and adhesive layer 158. In one embodiment, PET layer 156 has a thickness of 0.01-0.05 mm, ferrite layer 157 has a thickness of 0.05-0.30 mm, and adhesive layer 158 has a thickness of 0.01-0.05 mm.

Figure 2H:
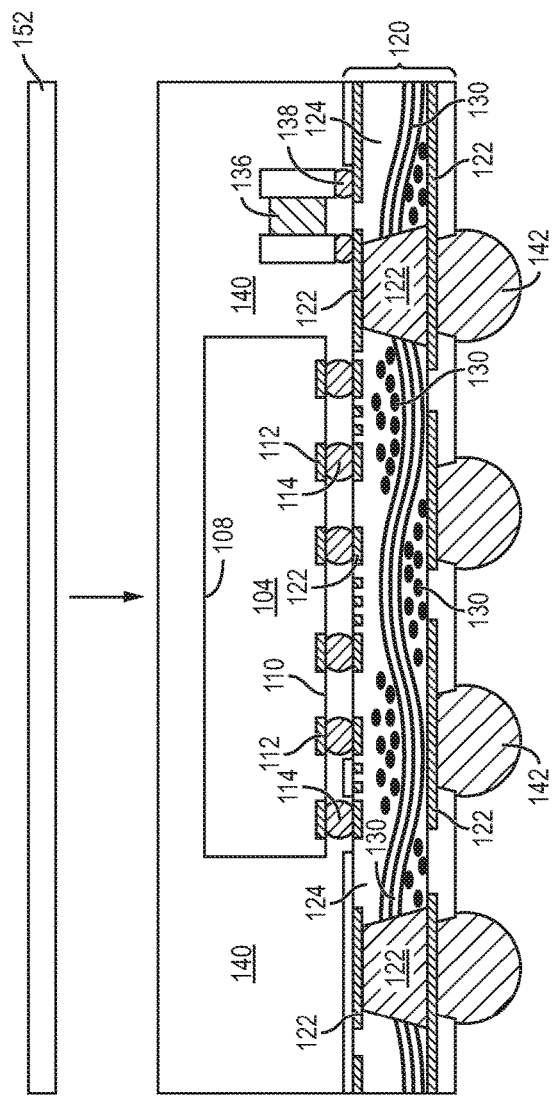

In FIG. 2h, one ferromagnetic film 152, as removed from sheet 154, is positioned over back surface 108 of semiconductor die 104. Each ferromagnetic film 152 has a length and a width less than or equal to with a length and width of encapsulant 140. FIG. 2i shows ferromagnetic film 152 bonded to back surface 108 of semiconductor die 104 with adhesive 158.

In FIG. 2j, a shielding layer 160 is formed over ferromagnetic material 150, side surfaces 162 of encapsulant 140, and side surfaces 164 of substrate 120. Shielding layer 160 can be one or more layers of Al, Cu, Sn, Ni, Au, Ag, or other suitable conductive material. Alternatively, shielding layer 160 can be carbonyl iron, stainless steel, nickel silver, low-carbon steel, silicon-iron steel, foil, conductive resin, carbon-black, aluminum flake, and other metals and composites capable of reducing the effects of magnetic flux B fields, EMI, RFI, and other inter-device interference.

Figure 3:
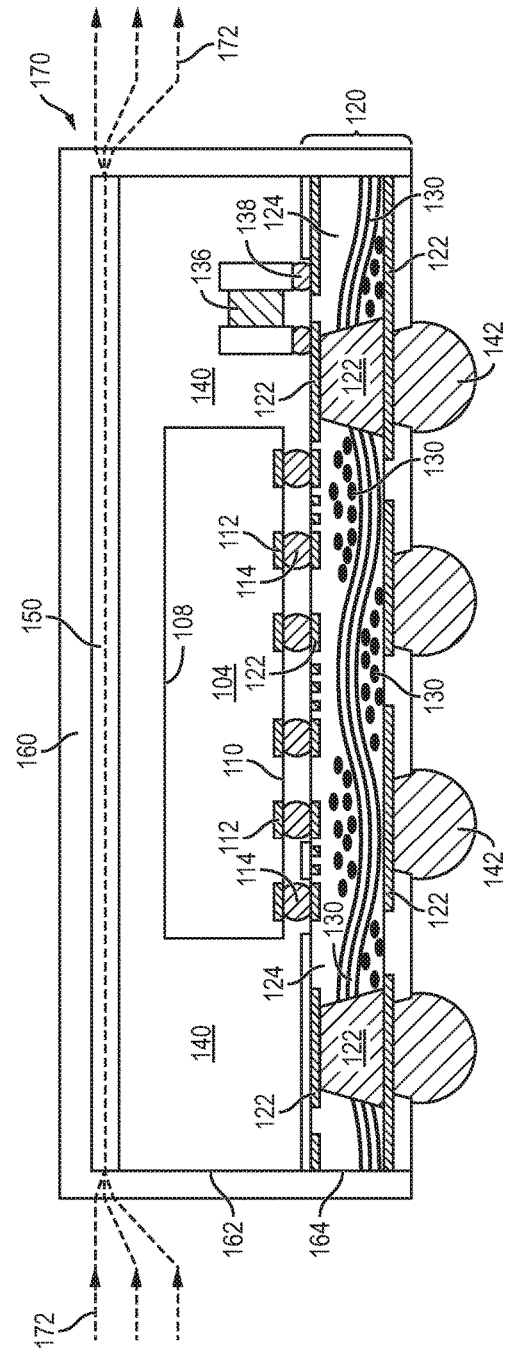
FIG. 3 illustrates a semiconductor package with magnetic field shielding using a ferromagnetic material.

FIG. 3 illustrates semiconductor package 170 with ferromagnetic material 150 and shielding layer 160 inducing external magnetic flux B fields 172 incident to the semiconductor package to flow through the ferromagnetic material due to the high permeability and low reluctance, rather than through semiconductor die 104 and discrete electrical device 136. Ferromagnetic material 150 provides magnetic shielding to reduce the influence of magnetic flux B fields 172 on semiconductor die 104 and discrete electrical device 136 over all frequency bands, including low-frequency interference, by forming a low reluctance magnetic flux loop to redirect the magnetic flux B fields away from semiconductor die 104 and discrete electrical device 136. Ferromagnetic material 150 reduces manufacturing cost to achieve magnetic shielding, e.g., by attachment of ferromagnetic film 152 as peeled from sheet 154.

Figure 4:
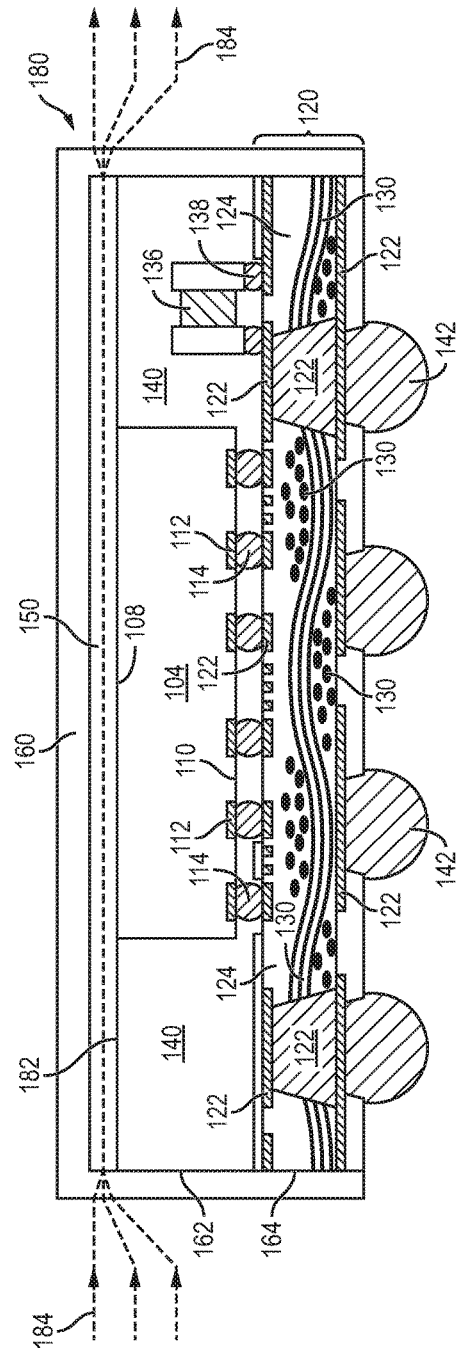
FIG. 4 illustrates another embodiment of a semiconductor package with magnetic field shielding using a ferromagnetic material.

FIG. 4 illustrates semiconductor package 180 with ferromagnetic material 150 contacting back surface 108 of semiconductor die 104. To expose back surface 108, encapsulant 140 undergoes a backgrinding operation or etching process to planarize surface 182 of encapsulant 140 with back surface 108 of semiconductor die 104. Again, ferromagnetic material 150 induces external magnetic flux B fields 184 incident to the semiconductor package to flow through the ferromagnetic material due to the high permeability and low reluctance, rather than through semiconductor die 104 and discrete electrical device 136. Ferromagnetic material 150 provides magnetic shielding to reduce the influence of magnetic flux B fields 184 on semiconductor die 104 and discrete electrical device 136 over all frequency bands, including low-frequency interference, by forming a low reluctance magnetic flux loop to redirect the magnetic flux B fields away from semiconductor die 104 and discrete electrical device 136. Ferromagnetic material 150 reduces manufacturing cost to achieve magnetic shielding, e.g., by attachment of ferromagnetic film 152 as peeled from sheet 154.

Figure 5:
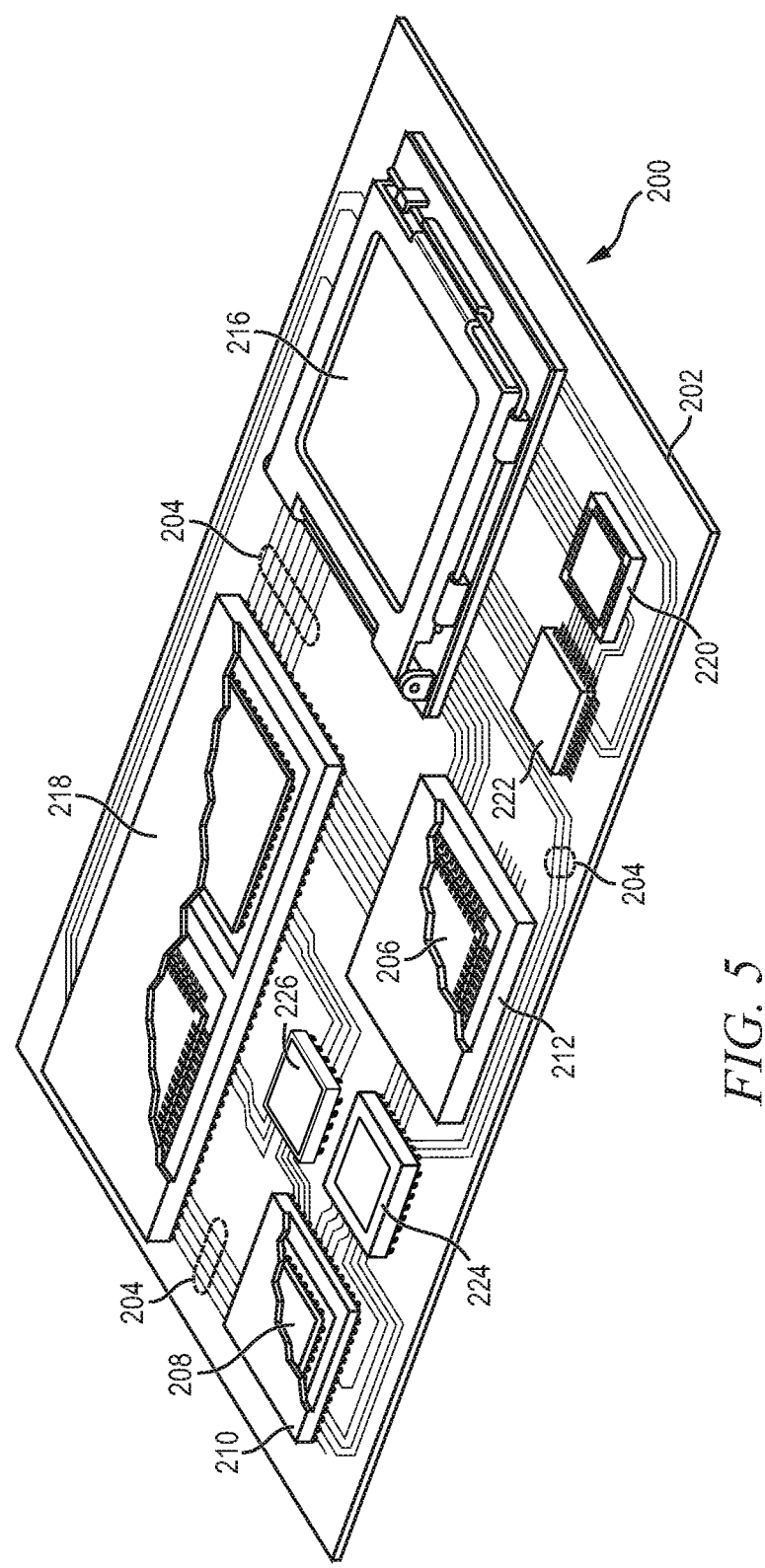
FIG. 5 illustrates a printed circuit board (PCB) with different types of packages mounted to a surface of the PCB.

FIG. 5 illustrates electronic device 200 having a chip carrier substrate or PCB 202 with a plurality of semiconductor packages mounted on a surface of PCB 202, including semiconductor package 170 or 180. Electronic device 200 can have one type of semiconductor package, or multiple types of semiconductor packages, depending on the application.

Electronic device 200 can be a stand-alone system that uses the semiconductor packages to perform one or more electrical functions. Alternatively, electronic device 200 can be a subcomponent of a larger system. For example, electronic device 200 can be part of a tablet, cellular phone, digital camera, communication system, or other electronic device. Alternatively, electronic device 200 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 5, PCB 202 provides a general substrate for structural support and electrical interconnect of the semiconductor packages mounted on the PCB. Conductive signal traces 204 are formed over a surface or within layers of PCB 202 using evaporation, electrolytic plating, electroless plating, screen printing, or other suitable metal deposition process. Signal traces 204 provide for electrical communication between each of the semiconductor packages, mounted components, and other external system components. Traces 204 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 206 and flipchip 208, are shown on PCB 202. Additionally, several types of second level packaging, including ball grid array (BGA) 210, bump chip carrier (BCC) 212, land grid array (LGA) 216, multi-chip module (MCM) 218, quad flat non-leaded package (QFN) 220, quad flat package 222, embedded wafer level ball grid array (eWLB) 224, and wafer level chip scale package (WLCSP) 226 are shown mounted on PCB 202. In one embodiment, eWLB 224 is a fan-out wafer level package (Fo-WLP) and WLCSP 226 is a fan-in wafer level package (Fi-WLP). Depending upon the system requirements, any combination of semiconductor packages, configured with any combination of first and second level packaging styles, as well as other electronic components, can be connected to PCB 202. In some embodiments, electronic device 200 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:
1. A method of making a semiconductor device, comprising:
   providing a substrate;
   disposing an electrical component over the substrate;
   depositing an encapsulant over the substrate and electrical component, wherein the encapsulant contacts the substrate and electrical component;
   disposing a ferromagnetic film including a ferrite layer and an adhesive layer over the encapsulant after depositing the encapsulant over the substrate and electrical component, wherein the ferromagnetic film is mechanically coupled to the encapsulant opposite the electrical component by the adhesive layer, and wherein the ferromagnetic film is in direct physical contact with a surface of the electrical component; and forming a shielding layer over the ferromagnetic film, encapsulant, and substrate, and around the electrical component after disposing the ferromagnetic film over the encapsulant, wherein the shielding layer contacts a side surface of the substrate, a side surface of the encapsulant, and a side surface of the ferromagnetic film.

2. The method of claim 1, wherein the ferromagnetic film further includes a polyethylene terephthalate layer.

3. The method of claim 1, further including:
providing a sheet of ferromagnetic films; and
removing the ferromagnetic film from the sheet of ferromagnetic films.

4. The method of claim 1, further including disposing a discrete electrical device over the substrate.

5. A method of making a semiconductor device, comprising:
providing a substrate;
disposing an electrical component over the substrate;
depositing an encapsulant over the electrical component;
disposing a ferromagnetic film over the encapsulant after depositing the encapsulant, wherein the ferromagnetic film includes a polyethylene terephthalate layer, ferrite layer, and adhesive layer; and
forming a shielding layer over the encapsulant and ferromagnetic film after disposing the ferromagnetic film over the encapsulant.

6. The method of claim 5, further including:
providing a sheet of ferromagnetic films; and
removing the ferromagnetic film from the sheet of ferromagnetic films.

7. The method of claim 5, further including disposing a discrete electrical device over the substrate adjacent to the electrical component, wherein the electrical component includes a semiconductor die.

8. The method of claim 5, further including depositing the encapsulant in contact with the electrical component and substrate.

9. The method of claim 5, further including disposing the ferromagnetic film in contact with the encapsulant.

10. The method of claim 5, further including forming the shielding layer in contact with the encapsulant and ferromagnetic film.

11. A semiconductor device, comprising:
a substrate;
an electrical component disposed over the substrate;
an encapsulant deposited over the substrate and electrical component;
a ferromagnetic film including an adhesive layer disposed over the encapsulant, wherein the ferromagnetic film is bonded to the encapsulant by the adhesive layer and the ferromagnetic film contacts a surface of the electrical component; and
a shielding layer formed over the ferromagnetic film and around the electrical component, wherein the shielding layer contacts a side surface of the encapsulant and a side surface of the substrate.

12. The semiconductor device of claim 11, wherein the ferromagnetic film further includes a polyethylene terephthalate layer and a ferrite layer.

13. The semiconductor device of claim 11, wherein a length and width of the ferromagnetic film in plan view coincide with a length and width of the encapsulant in plan view.

14. The semiconductor device of claim 11, further including a discrete electrical device disposed over the substrate.

15. The semiconductor device of claim 11, wherein the ferromagnetic film contacts the encapsulant.

16. The semiconductor device of claim 15, wherein the shielding layer contacts the ferromagnetic film.

17. A semiconductor device, comprising:
a substrate;
an electrical component disposed over the substrate;
an encapsulant deposited in contact with the electrical component;
a ferromagnetic film disposed over the encapsulant, wherein the ferromagnetic film includes a polyethylene terephthalate layer, ferrite layer, and adhesive layer; and
a shielding layer formed over the encapsulant and ferromagnetic film, wherein the shielding layer directly physically contacts a side surface of the encapsulant, a side surface of the ferromagnetic film, and a side surface of the substrate.

18. The semiconductor device of claim 17, further including a discrete electrical device disposed over the substrate.

19. The semiconductor device of claim 17, wherein the ferromagnetic film is disposed in contact with the encapsulant.

20. The semiconductor device of claim 19, wherein the shielding layer is formed in contact with the encapsulant.

21. The semiconductor device of claim 20, wherein the shielding layer is formed in contact with the ferromagnetic film.

* * * * *